(12) United States Patent
Kienle et al.

(10) Patent No.: US 11,355,284 B2
(45) Date of Patent: Jun. 7, 2022

(54) COOLING DEVICE FOR COOLING A POWER COMPONENT

(71) Applicant: Robert Bosch GmbH, Stuttgart (DE)

(72) Inventors: Wolfram Kienle, Magstadt (DE); Alexandre Lehr, Boeblingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/978,471

(22) PCT Filed: Jan. 17, 2019

(86) PCT No.: PCT/EP2019/051131
§ 371 (c)(1),
(2) Date: Sep. 4, 2020

(87) PCT Pub. No.: WO2019/170307
PCT Pub. Date: Sep. 12, 2019

(65) Prior Publication Data
US 2021/0043376 A1 Feb. 11, 2021

(30) Foreign Application Priority Data

Mar. 7, 2018 (DE) ..................... 10 2018 203 362.5

(51) Int. Cl.
*H05K 7/20* (2006.01)
*H01G 2/08* (2006.01)

(52) U.S. Cl.
CPC ........... *H01G 2/08* (2013.01); *H05K 7/20236* (2013.01); *H05K 7/20254* (2013.01)

(58) Field of Classification Search
CPC ... H01G 2/08; H05K 7/20236; H05K 7/20254
(Continued)

(56) References Cited

U.S. PATENT DOCUMENTS 4,448,240 A * 5/1984 Sharon ................ H01L 23/4338
165/185
4,748,495 A * 5/1988 Kucharek ........... H01L 23/4338
174/16.3
(Continued)

FOREIGN PATENT DOCUMENTS

CN 204929511 12/2015
DE 102008033473 5/2009
(Continued)

OTHER PUBLICATIONS

International Search Report for Application No. PCT/EP2019/051131 dated Apr. 16, 2019 (English Translation, 3 pages).

*Primary Examiner* — Anatoly Vortman
(74) *Attorney, Agent, or Firm* — Michael Best & Friedrich LLP

(57) ABSTRACT

The invention relates to a cooling device for cooling a power component, the cooling device having a one-piece cooling housing with a base, a first end face, a second end face, a first lateral face, and a second lateral face, which define a receiving area for receiving the power component. The cooling device further includes an inlet for supplying a cooling medium, an outlet for discharging a cooling medium, a first cooling channel, a second cooling channel, a third cooling channel, and a fourth cooling channel. The first cooling channel is arranged on the first end face, the second cooling channel is arranged on the second end face, the third cooling channel is arranged on the first lateral face, the fourth cooling channel is arranged on the second lateral face, and the first and the second cooling channel are each fluidically connected to the third and fourth cooling channel.

15 Claims, 5 Drawing Sheets

(58) Field of Classification Search
USPC .................................................. 361/274.2
See application file for complete search history.

(56) References Cited

U.S. PATENT DOCUMENTS

| | | | | |
|---|---|---|---|---|
| 4,998,181 A * | 3/1991 | Haws | ................... | F28D 7/0041 |
| | | | | 165/80.4 |
| 5,016,090 A * | 5/1991 | Galyon | ............... | H01L 23/4336 |
| | | | | 257/714 |
| 7,990,711 B1 | 8/2011 | Andry et al. | | |
| 8,929,080 B2 * | 1/2015 | Campbell | .......... | H05K 7/20236 |
| | | | | 361/719 |
| 9,345,169 B1 * | 5/2016 | Campbell | .......... | H05K 7/20772 |
| 2008/0224303 A1 | 9/2008 | Funakoshi et al. | | |
| 2009/0021971 A1 | 1/2009 | Korich et al. | | |
| 2009/0284923 A1 | 11/2009 | Rytka et al. | | |
| 2011/0170259 A1 | 7/2011 | Miller et al. | | |
| 2016/0105998 A1 * | 4/2016 | Lodholz | ............. | H05K 7/20272 |
| | | | | 361/698 |
| 2017/0040241 A1 | 2/2017 | Koshida | | |
| 2017/0071075 A1 | 3/2017 | Hayakawa et al. | | |
| 2018/0003451 A1 * | 1/2018 | Azar | ........................ | F28D 7/12 |

FOREIGN PATENT DOCUMENTS

| | | |
|---|---|---|
| DE | 102009028898 | 4/2010 |
| DE | 102014013958 | 3/2016 |
| EP | 2597676 | 5/2013 |
| JP | H1154356 A | 2/1999 |
| JP | 2007095732 A | 4/2007 |
| JP | 2011109740 A | 6/2011 |
| JP | 2012028595 A | 2/2012 |
| JP | 201547050 | 3/2015 |
| JP | 2017017862 A | 1/2017 |

* cited by examiner

COOLING DEVICE FOR COOLING A POWER COMPONENT

BACKGROUND

The present invention relates to a cooling device for cooling a power component, and to an electronic assembly having a cooling device of this type, a power component and a control device of a vehicle.

Control devices, particularly for vehicles, pose a major challenge in that power components such as e.g. capacitors, reactance coils, power circuit-breakers or similar must be spatially arranged in order to permit the electrical connection thereof in accordance with a circuit diagram and, at the same time, must be producible, suitable for the installation space and electrically appropriate. Furthermore electrical and thermal requirements apply with respect to issues of inductance and heat. Thus, for example, capacitors are also installed in control devices, in order to permit the most rapid coverage of short-term electric current requirements. As a result, however, additional problems of heat-up can occur in the control device.

SUMMARY

Conversely, the cooling device according to the invention for cooling a power component provides an advantage, in that a significantly improved cooling capacity can be achieved such that, in particular, the power component can also be installed in a control device of a vehicle in a problem-free manner. An exceptionally compact and simple design layout can be achieved and, moreover, a highly effective electrical connection of the power component is also permitted. This is achieved according to the invention, wherein the cooling device comprises a cooling housing having a base and four housing surfaces. The cooling housing defines a central component receiving area for the accommodation of the power component. The cooling housing is provided with an inlet for the admission of a cooling medium, and with an outlet for discharging the heated cooling medium. A first, second, third and fourth cooling channel are further provided, wherein the first and second cooling channels are configured on the first and second end faces of the cooling housing. The third and fourth channels are configured on first and second lateral faces of the cooling housing. Moreover, the first and the second cooling channels are fluidically connected to the third and fourth cooling channels. A first and a second cooling plate, which are arranged on the first and second lateral faces, delimit the third and fourth cooling channels, particularly from the outer side of the cooling housing. A third and fourth cooling plate are further provided, which delimit the first and second cooling channels at the two end faces. The cooling housing is closed by a cover. A twin-walled cooling device having a base and a cover is thus provided, which comprises a central receiving area for the power component. The base and the four housing faces are configured as a one-piece component, and are preferably formed of a metallic material having a high thermal conductivity, particularly aluminum. By the provision of separate cooling plates on the two lateral faces, moreover, individual configurations of cooling devices can be achieved in a simple and cost-effective manner. Thus, e.g. by the selection of the cooling plates on the lateral faces, thermal conductivity can be adapted to the respective power component which is arranged in the cooling device.

It is further preferred that a third and fourth cooling plate, which delimit the first and second cooling channels at the end faces, are likewise configured integrally with the cooling housing. It is particularly preferred that the base of the cooling housing is extended at the end faces, and that the third and fourth cooling plates are then arranged on the resulting overhangs.

It is further preferred that the inlet and/or outlet are arranged directly on the third and fourth cooling plates. As a result, a further cost saving can be achieved.

According to a further preferred configuration of the invention, the cooling device further comprises a fifth cooling channel, which is configured on the base of the cooling housing and is delimited by means of a third cooling plate. Five sides of the power component can be cooled accordingly. The fifth cooling channel is preferably fluidically connected to the first and/or second cooling channel. Alternatively, the fifth cooling channel is fluidically connected to the third and/or fourth cooling channel.

It is further preferred that the cover of the cooling device is comprised of an electrically insulating material, particularly of an electrically insulating plastic. The cooling housing is preferably comprised of metal, particularly of aluminum, and the separate lateral faces are preferably comprised of copper or of aluminum.

According to a further preferred configuration of the invention, the inlet and the outlet are arranged together on the first end face of the cooling housing. As a result, in particular, the arrangement of an intake line and a discharge line on the cooling device can be simplified. The first end face preferably comprises a fluid divider, in particular a separating wall, for the separation of the inlet from the outlet.

Alternatively, the inlet and the outlet are arranged on mutually opposing end faces of the cooling device. As a result, the cooling device assumes only one direction of flow through the cooling channels.

It is further preferred that, on the first and second lateral cooling plates in the cooling channels, projecting elements such as, for example, cooling ribs, cooling cylinders or similar are provided. As a result, a turbulent flux is generated in the cooling channel, by means of which the evacuation of heat can be improved.

The present invention further relates to an electronic assembly having a cooling device according to the invention, and to a power component arranged in the cooling housing. The power component is embedded in the cooling housing, preferably by means of a casting compound. By this arrangement, the casting compound can permit the electrical isolation of the power component from the cooling housing, where the casting compound is comprised of an electrically non-conductive material. The power component is preferably a capacitor, particularly an intermediate circuit capacitor.

It is further preferred that the electronic assembly comprises a first and a second power circuit-breaker, which are arranged on the first and second cooling plate of the cooling device. It is particularly preferred that the first and second power circuit-breakers are arranged symmetrically to a longitudinal plane of the electronic assembly. Equal electrical conductor lengths from the power circuit-breakers to the power component which is arranged in the cooling housing can thus be ensured.

It is further preferred that the electronic assembly comprises an electrical connection, which is arranged in the cover of the cooling device. The electrical connection is preferably executed on a busbar. It is further preferred that electrical contact-connection with the power circuit-breakers is executed by means of a bonded connection.

The present invention further relates to a control device of a vehicle having an electronic assembly according to the invention. The control device is preferably employed for the actuation of an electrical machine of the vehicle, and comprises an intermediate circuit capacitor. As a result, a rapid actuation of the electrical machine can be ensured, with short line paths and a low electrical inductance.

BRIEF DESCRIPTION OF THE DRAWINGS

Preferred exemplary embodiments of the invention are described in detail hereinafter, with reference to the accompanying drawing. In the drawing.

DETAILED DESCRIPTION

Figure 1:
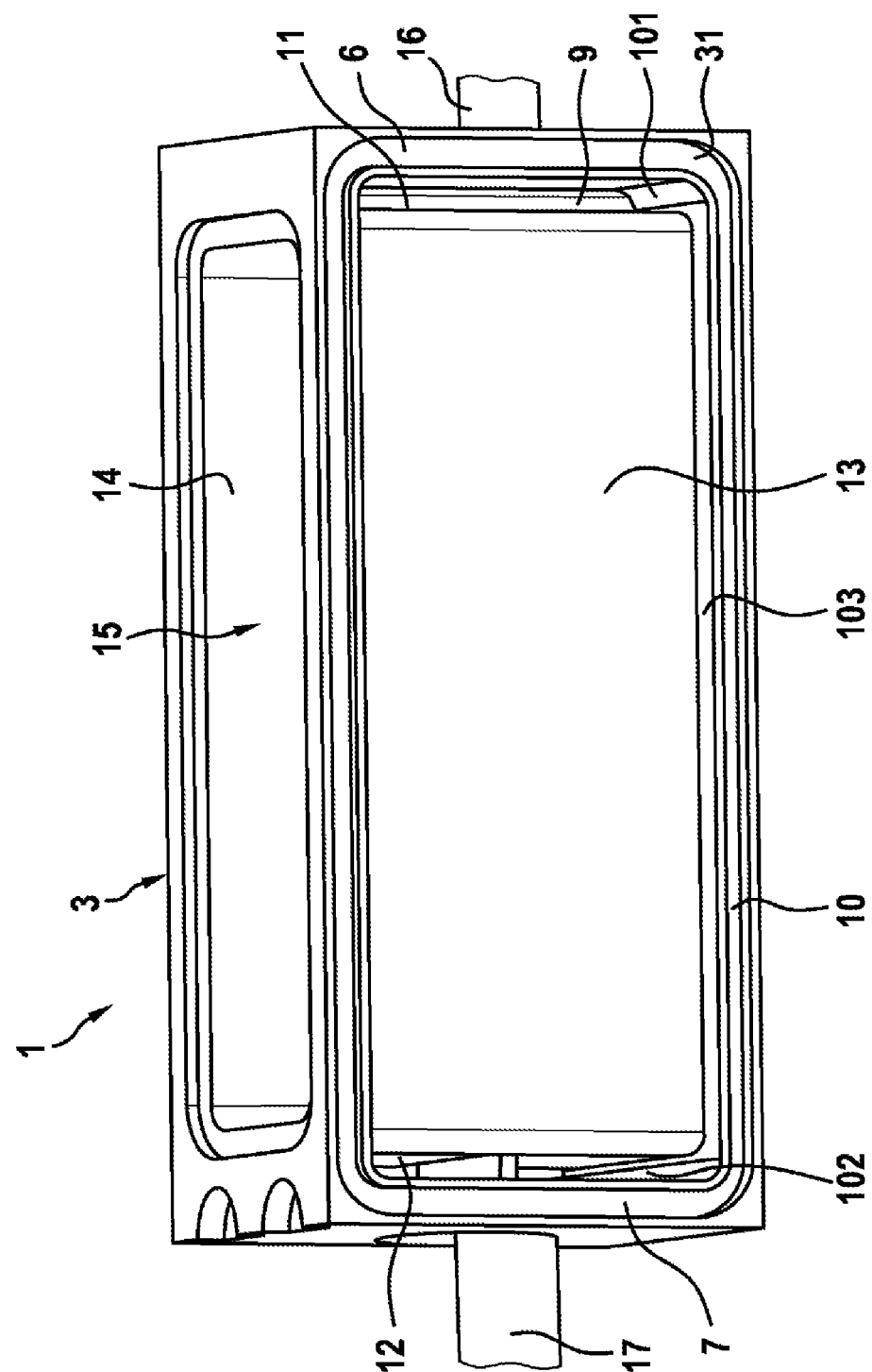
FIG. 1 shows a schematic perspective view of a cooling housing of a cooling device according to a first exemplary embodiment of the invention.

An electronic assembly 100 having a cooling device 1 according to a first preferred exemplary embodiment of the invention is described in detail hereinafter with reference to FIGS. 1 to 4. As can particularly be seen from FIGS. 1 and 3, the cooling device 1 comprises a one-piece cooling housing 3 having five housing faces. The cooling housing 3 comprises a base 10, a first end face 11, a second end face 12, a first lateral face 13 and a second lateral face 14. This produces a cuboid cooling housing having five housing faces, and which is open at the top. The cooling housing 3 defines a central receiving area 15 for the accommodation of a power component 2, as represented in FIG. 2.

The cooling device 1 further comprises an inlet 16 and an outlet 17. A cooling medium is admitted to the cooling device 1 via the inlet and is discharged via the outlet 17. To this end, cooling channels are defined in the outer perimeter of the cooling housing 3. More specifically, a first cooling channel 101 is configured on the first end face 11, and a second cooling channel 102 is configured on the second end face 12. A third cooling channel 103 is configured on the first lateral face 13, and a fourth cooling channel 104 is configured on the second lateral face 14. In this case, the first and second cooling channels 101, 102 are fluidically connected to the third and fourth cooling channels 103, 104, such that the cooling medium, originating from the inlet, can flow via the cooling channels to the outlet 17.

Figure 2:
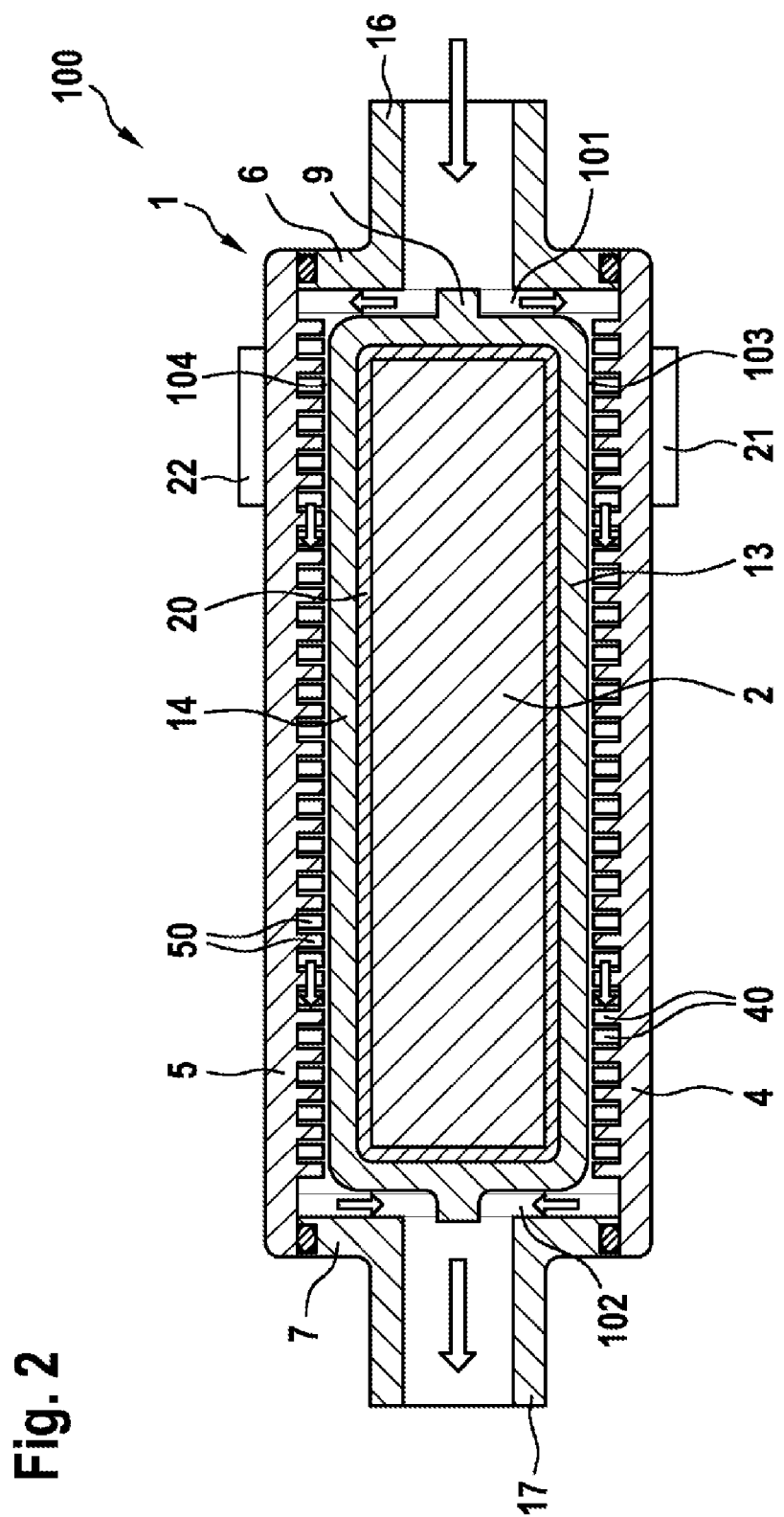
FIG. 2 shows a schematic sectional view of the cooling device to the first exemplary embodiment.

As can particularly be seen from FIGS. 1 and 2, the cooling channels 101, 102, 103, 104 in the present exemplary embodiment are two-dimensional cooling channels. The cooling channels are defined firstly by the housing faces of the cooling housing 3, and secondly by cooling plates, as described hereinafter. The cooling device 1 comprises a first cooling plate 4, which is arranged on the first lateral face 13 and defines the third cooling channel 103. A second cooling plate 5 is further provided, which is arranged on the second lateral face 14 and defines the fourth cooling channel 103. Moreover, a third cooling plate 6 is provided, which is arranged on the first end face 11 and defines the first cooling channel 101. A fourth cooling plate 7 is further provided, which is arranged on the second end face 12 and defines the second cooling channel 102 (c.f. FIG. 2).

In this exemplary embodiment, the third cooling plate 6 and the fourth cooling plate 7 are likewise configured integrally with the cooling housing 3. Moreover, the inlet 16 and the outlet 17 are also configured integrally with the cooling plates 6, 7 on the first and second end faces 11, 12.

The one-piece cooling housing 3 in the present exemplary embodiment is comprised of a metal, preferably of aluminum. As can particularly be seen from FIG. 3, the third cooling plate 6 and the fourth cooling plate 7 are connected to the cooling housing by means of the base 10, which projects at the end sides beyond the end faces 11, 12. Moreover, as represented in FIG. 1, a frame-like structure is provided, in the region which is arranged opposite the base, for the attachment of the third and fourth cooling plates 6, 7 and the accommodation of a cover 8.

The cooling device thus comprises a central receiving area 15 for the accommodation of a power component 2, around which a cooling medium can flow from four sides. By means of the two-dimensional configuration of the cooling channels 101, 102, 103, 104, a sufficient evacuation of heat can thus be ensured. The throughflow of cooling medium in the cooling device 1 is indicated in FIG. 2 by the arrow.

As can further be seen from FIG. 2, on the sides of the first and second cooling plates 4, 5 which are oriented towards the cooling housing 3, heat sinks 40, 50 are respectively provided, which project in the direction of the first and second lateral faces 13, 14. The projecting heat sinks 40, 50 are preferably cylinders, and are arranged with an offset, in order to generate a turbulent flux.

Figure 3:
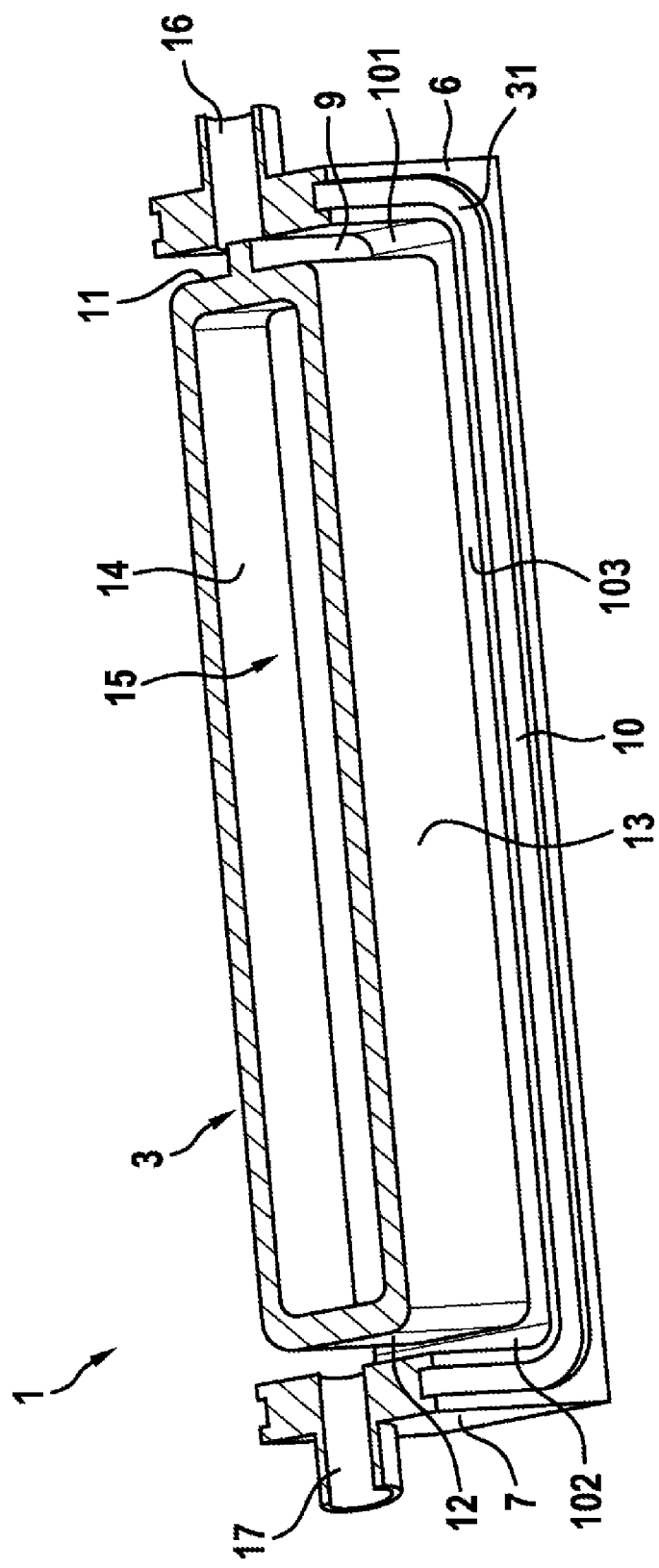
FIG. 3 shows a perspective sectional view of the cooling housing of FIG. 1.

As can further be seen from FIGS. 2 and 3, a fluid divider 9 is additionally configured on the first end face 11, which projects vertically from the base 10. As a result, cooling medium which is admitted via the inlet 16 is divided into two streams, which thus flow along the two lateral faces 13, 14. By this arrangement, a symmetrical distribution of the cooling medium is preferably provided.

Figure 4:
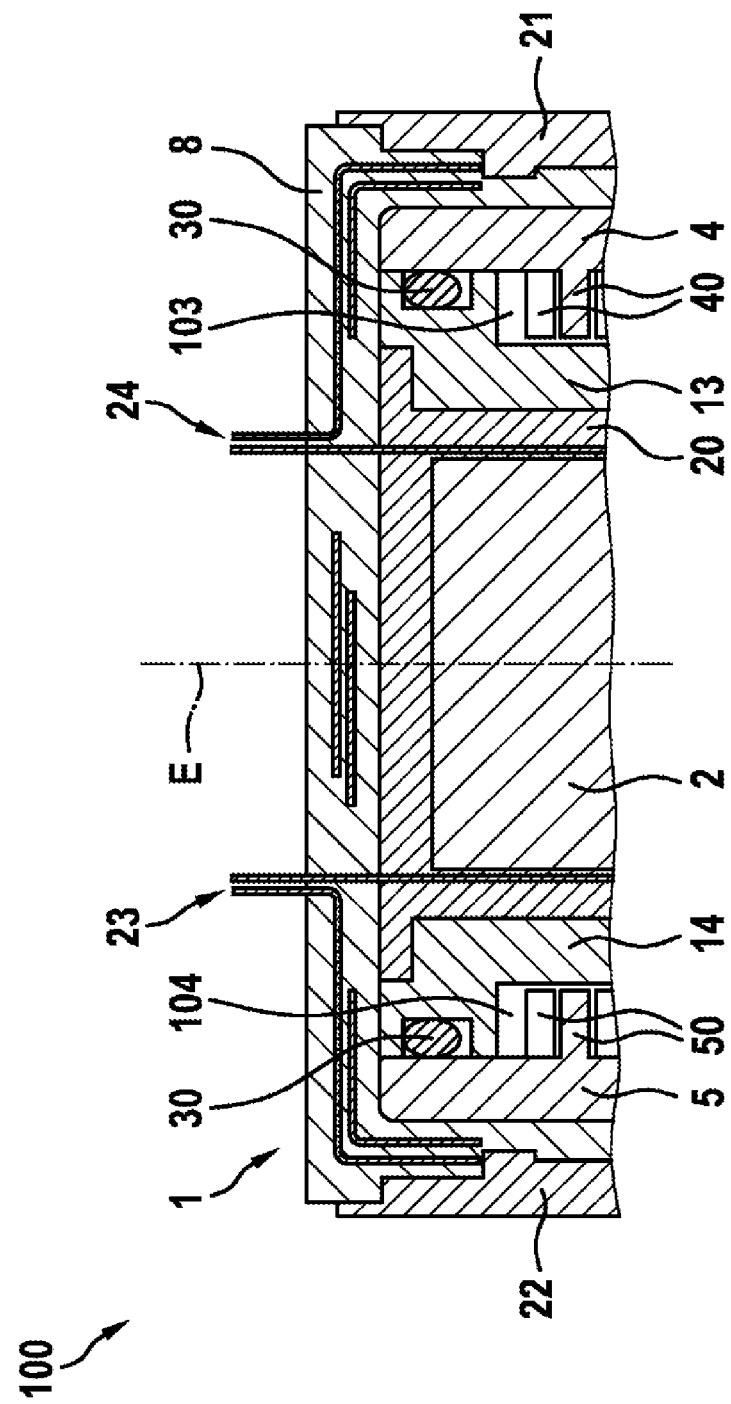
FIG. 4 shows a partial sectional view of the cooling device according to FIG. 2.

The cooling device 1 further comprises the cover 8, which can be seen in detail in FIG. 4. The cover 8 is manufactured of an electrically insulating material, particularly a plastic. In particular, the cover 8 covers the power component 2 which is arranged in the central receiving area 15. As can be seen from FIG. 4, the power component 2 is arranged in a casting compound 20, in order to prevent any electrical contact with the first and second lateral faces 13, 14. A direct casting of the power component 2 in the cooling housing 3 can thus be achieved.

The electronic assembly 100 further comprises a first power circuit-breaker 21 and a second power circuit-breaker 22. As shown in FIG. 4, the two power circuit-breakers 21, 22 are electrically connected by means of electrical conductors to a first and second busbar terminal 23, 24. The power component 2 is also electrically connected to the busbar terminals 23, 24. The two power circuit-breakers 21, 22 are arranged symmetrically to a mid-plane E of the electronic assembly 100. It is thus possible, in a simple manner, for equal electrical conductor lengths to be provided between the busbar terminals 23, 24 and the power circuit-breakers 21, 22.

The electronic assembly 100 thus comprises a cooling device 1 having four two-dimensional cooling channels 101, 102, 103, 104, which are arranged on the two end faces and on the two lateral faces of the cooling device. The power component 2 can thus be cooled on four sides.

The power component 2 in the present exemplary embodiment is a capacitor, which is employed in a control device of a vehicle. As the capacitor can be directly arranged in the control device, the requisite electric power can be rapidly delivered to the control device by the capacitor. As a result, in particular, the electrical wiring is provided in a symmetrical arrangement which also features a low inductance, on the grounds that, by the symmetrical arrangement of the power circuit-breakers 21, 22, electric fields are essentially cancelled out. The capacitor is preferably an intermediate circuit capacitor, and is employed in a control device for the actuation of an electrical machine of a vehicle. A six-pole machine actuation function can be executed, or a dual inverter can also be employed for two three-pole electrical machines.

For the sealing of the cooling channels, as shown in FIG. 4, seals 30 are provided between the first and second lateral faces 13, 14 and between the first and second cooling plates 4, 5. The seals can be inserted in recesses 31 which are provided in the cooling housing 3. The cooling plates 4, 5 can be welded or adhesively bonded to the cooling housing.

Figure 5:
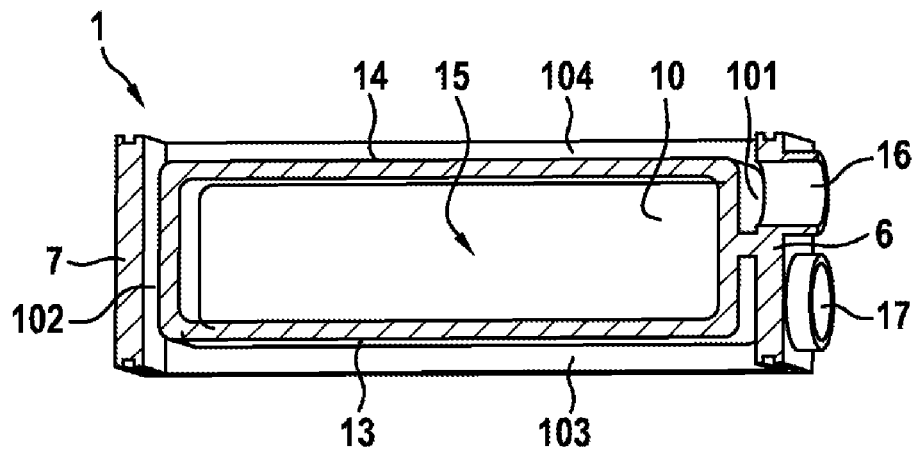
FIG. 5 shows a perspective sectional view of a cooling device of a second exemplary embodiment.
Figure 6:
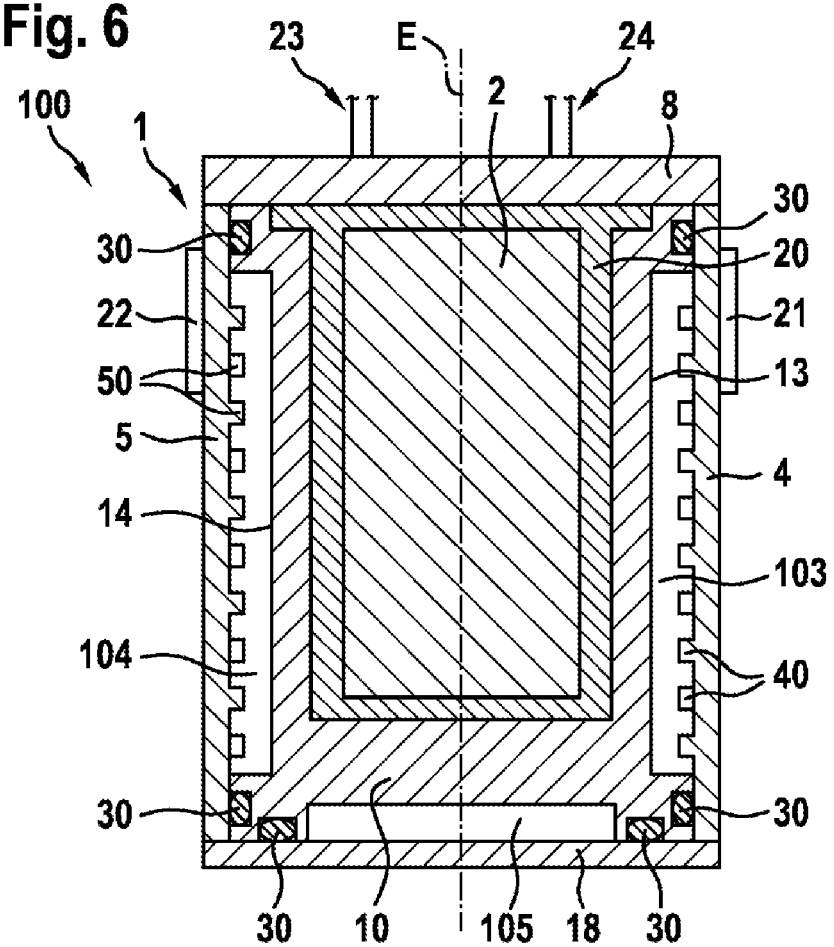
FIG. 6 shows a sectional view of a cooling device of the second exemplary embodiment.

FIGS. 5 and 6 show an electronic assembly 100 having a cooling device 1 according to a second exemplary embodiment of the invention. Identical or functionally equivalent components are identified by the same reference numbers. By way of distinction from the first exemplary embodiment, the cooling device 1 of the second exemplary embodiment additionally comprises a fifth cooling channel 105. The fifth cooling channel 105 is defined between the base 10 and a fifth cooling plate 18. As can be seen from FIG. 5, the inlet 16 and the outlet 17 are arranged on the same end face of the cooling device 1, namely, in the present exemplary embodiment, on the first end face 11. The fifth cooling channel 105 is thus employed for the backflow of cooling medium from the second end face 12. By this arrangement, in particular, a fluid connection for the fluid medium can be configured on the cooling device 1 in a simpler manner. It should be observed here that the cooling device of to the second exemplary embodiment might also be configured such that the fifth cooling channel 105 is not directly connected to the outlet 17, but is connected directly to the inlet 16, and the outlet 17 is then fluidically connected to the other cooling channels via the first cooling channel 101.

What is claimed is:

1. An electronic assembly comprising a cooling device (1), and a power component (2) arranged in the cooling device, the cooling device for cooling the power component (2), the cooling device (1) comprising:
   a one-piece cooling housing (3) having a base (10), a first end face (11), a second end face (12), a first lateral face (13) and a second lateral face (14), which define a receiving area (15) which is designed for the accommodation of the power component,
   an inlet (16) for the admission of a cooling medium,
   an outlet (17) for discharging the cooling medium,
   a first cooling channel (101), a second cooling channel (102), a third cooling channel (103) and a fourth cooling channel (104), wherein the first cooling channel (101) is arranged on the first end face (11) and the second cooling channel (102) is arranged on the second end face (12), and
   wherein the third cooling channel (103) is arranged on the first lateral face (13), and the fourth cooling channel (104) is arranged on the second lateral face (14),
   wherein the first and second cooling channels (101, 102) are respectively fluidically connected to the third and fourth cooling channels (103, 104),
   a separate first cooling plate (4) and a separate second cooling plate (5), wherein the first cooling plate (4) is arranged on the first lateral face (13) and the second cooling plate (5) is arranged on the second lateral face (14), in order to delimit the third and fourth cooling channels (103, 104),
   a third cooling plate (6), which is arranged on the first end face (11) and a fourth cooling plate (7), which is arranged on the second end face (12), wherein the third cooling plate (6) delimits the first cooling channel (101) and the fourth cooling plate (7) delimits the second cooling channel (102), and
   a cover (8), which closes the cooling housing (3), and
   the electronic assembly further comprising a first power circuit-breaker (21) and a second power circuit-breaker (22), wherein the first power circuit-breaker (21) is arranged on the first cooling plate (4), and the second power circuit-breaker (22) is arranged on the second cooling plate (5).

2. The electronic assembly as claimed in claim 1, wherein the third cooling plate (6) and the fourth cooling plate (7) are configured integrally with the cooling housing (3).

3. The electronic assembly as claimed in claim 2, wherein at least one of the inlet (16) and the outlet (17) is configured integrally with the third cooling plate (6) or the fourth cooling plate (7).

4. The electronic assembly as claimed in claim 1, further comprising a fifth cooling channel (105), which is configured on the base (10) of the cooling housing (3) and is delimited by a fifth cooling plate (18).

5. The electronic assembly as claimed in claim 4, wherein the fifth cooling channel (105) is fluidically connected to at least one of the first cooling channel (101) and the second cooling channel (102).

6. The electronic assembly as claimed in claim 1, wherein (i) the inlet (16) and the outlet (17) are arranged on the third cooling plate (6), or (ii) the inlet (16) is arranged on the third cooling plate (6) and the outlet (17) is arranged on the fourth cooling plate (7).

7. The electronic assembly as claimed in claim 1, wherein a fluid divider (9) is arranged in the first cooling channel (101).

8. The electronic assembly as claimed in claim 1, wherein the cooling housing (3) assumes a cuboid shape.

9. The electronic assembly as claimed in claim 1, wherein the power component (2) is embedded in the cooling housing (3) of the cooling device (1) by a casting compound (20).

10. The electronic assembly as claimed in claim 1, wherein the first power circuit-breaker (21) and the second power circuit-breaker (22) are arranged symmetrically to a longitudinal plane (E) of the electronic assembly.

11. The electronic assembly as claimed in claim 1, further comprising at least one busbar terminal (23, 24), wherein the busbar terminal (23, 24) is arranged in the cover (8) of the cooling device (1).

12. The electronic assembly as claimed in claim 1, wherein the power component (2) is a capacitor.

13. A control device of a vehicle, comprising the electronic assembly as claimed in claim 1.

14. The electronic assembly as claimed in claim 12, wherein the capacitor is an intermediate circuit capacitor.

15. The control device of a vehicle as claimed in claim 13, wherein the control device controls an electrical machine.

* * * * *